(12) United States Patent
Song et al.

(10) Patent No.: US 7,700,949 B2
(45) Date of Patent: Apr. 20, 2010

(54) THIN FILM TRANSISTOR ARRAY SUBSTRATE, METHOD FOR MANUFACTURING THE SAME, LIQUID CRYSTAL DISPLAY HAVING THE SUBSTRATE, AND METHOD FOR MANUFACTURING THE LIQUID CRYSTAL DISPLAY

(75) Inventors: Keun-Kyu Song, Seongnam-si (KR); Young-Chol Yang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 11/240,550

(22) Filed: Oct. 3, 2005

(65) Prior Publication Data

US 2006/0071212 A1    Apr. 6, 2006

(30) Foreign Application Priority Data

Oct. 6, 2004    (KR)    ............... 10-2004-0079476

(51) Int. Cl.
*H01L 31/036* (2006.01)
*H01L 39/00* (2006.01)

(52) U.S. Cl. ............... 257/59; 257/72; 257/E21.615; 257/E27.111; 438/30; 438/48; 438/52; 438/158

(58) Field of Classification Search ............ 257/57–59, 257/66–72, 347–350, E29.273–E29.299, 257/E29.314, E29.32, E23.016; 349/144, 349/38–39, 41–43, 142, 143, 199; 438/30, 438/155–158, 48–52

See application file for complete search history.

(56) References Cited

U.S. PATENT DOCUMENTS

| 5,631,473 | A | 5/1997 | Possin et al. | |
|---|---|---|---|---|
| 6,255,130 | B1 * | 7/2001 | Kim | 438/30 |
| 6,353,229 | B1 * | 3/2002 | Polischuk et al. | 250/370.14 |
| 6,403,980 | B1 * | 6/2002 | Park | 257/59 |
| 6,429,057 | B1 * | 8/2002 | Hong et al. | 438/158 |
| 6,441,401 | B1 * | 8/2002 | Jung et al. | 257/72 |
| 6,449,025 | B2 * | 9/2002 | Lee | 349/129 |
| 6,555,876 | B2 * | 4/2003 | Jun et al. | 257/350 |
| 6,573,532 | B2 * | 6/2003 | Park | 257/59 |
| 6,628,368 | B2 | 9/2003 | Yang | |
| 6,642,074 | B2 * | 11/2003 | Hong et al. | 438/30 |
| 6,657,231 | B2 * | 12/2003 | Jung et al. | 257/72 |
| 6,665,035 | B2 * | 12/2003 | Lee | 349/129 |
| 6,680,770 | B1 * | 1/2004 | Nagase | 349/139 |
| 6,710,372 | B2 * | 3/2004 | Kim | 257/72 |
| 6,784,949 | B1 * | 8/2004 | Nagata et al. | 349/39 |
| 6,809,335 | B2 * | 10/2004 | Park | 257/59 |

(Continued)

FOREIGN PATENT DOCUMENTS

JP    06051348    2/1994

(Continued)

*Primary Examiner*—Dung A. Le
(74) *Attorney, Agent, or Firm*—Cantor Colburn LLP

(57) ABSTRACT

A liquid crystal display has, a plurality of pixel including a switching element, a plurality of gate lines extending transversally, a plurality of data lines extending longitudinally, a first storage electrode line extending transversally, a second storage electrode line extending longitudinally, a third storage electrode line connecting two of the adjacent second storage electrode line, a repair assistant formed in an area that the data line crosses over the third storage electrode line. The liquid crystal display can be repaired with good quality by shortening the repair path.

19 Claims, 9 Drawing Sheets

U.S. PATENT DOCUMENTS

| | | | |
|---|---|---|---|
| 6,855,955 B2 * | 2/2005 | Jeon et al. | 257/59 |
| 6,969,872 B2 * | 11/2005 | Kim | 257/72 |
| 7,015,548 B2 * | 3/2006 | Song et al. | 257/347 |
| 7,019,805 B2 * | 3/2006 | Kim et al. | 349/129 |
| 7,078,255 B2 * | 7/2006 | Hong et al. | 438/30 |
| 7,112,476 B2 * | 9/2006 | Kim et al. | 438/155 |
| 7,129,106 B2 * | 10/2006 | Lee | 438/30 |
| 7,151,279 B2 * | 12/2006 | Jun et al. | 257/72 |
| 7,206,054 B2 * | 4/2007 | Kim | 349/144 |
| 7,208,718 B2 * | 4/2007 | Park et al. | 250/214 R |
| 7,280,167 B2 * | 10/2007 | Choi et al. | 349/12 |
| 2002/0145695 A1 * | 10/2002 | Kim et al. | 349/141 |
| 2004/0046209 A1 * | 3/2004 | Sera et al. | 257/350 |
| 2005/0104069 A1 * | 5/2005 | Jun et al. | 257/72 |
| 2005/0280121 A1 * | 12/2005 | Doris et al. | 257/629 |
| 2007/0030407 A1 * | 2/2007 | Kwak et al. | 349/38 |

FOREIGN PATENT DOCUMENTS

| | | |
|---|---|---|
| JP | 09179096 | 7/1997 |
| JP | 2001109015 | 4/2001 |
| JP | 2001305586 | 10/2001 |
| KR | 100250972 | 1/2000 |
| KR | 1020010050708 | 6/2001 |
| KR | 1020020017437 | 3/2002 |
| KR | 1020030030740 | 4/2003 |
| KR | 1020030089926 | 11/2003 |
| KR | 1020040059672 | 7/2004 |
| KR | 1020040061771 | 7/2004 |
| KR | 1020040061784 | 7/2004 |

* cited by examiner

THIN FILM TRANSISTOR ARRAY SUBSTRATE, METHOD FOR MANUFACTURING THE SAME, LIQUID CRYSTAL DISPLAY HAVING THE SUBSTRATE, AND METHOD FOR MANUFACTURING THE LIQUID CRYSTAL DISPLAY

CROSS REFERENCE TO RELATED APPLICATION

This application claims priority to and the benefit of Korean Patent Applications No. 2004-079476, filed on Oct. 6, 2004, which is hereby incorporated by reference for all purposes as if fully set forth herein.

BACKGROUND OF THE INVENTION

1. Field of the Invention

The present invention relates to a liquid crystal display (LCD), an array substrate characterizing a large size display, and a method for manufacturing the array substrate and the LCD.

2. Discussion of the Background

A liquid crystal display (LCD) comprises a lower substrate, an upper substrate and a liquid crystal (LC) layer confined between the upper substrate and the lower substrate. A pixel electrode is formed on the lower substrate, which may also be referred to as a thin film transistor substrate. The upper substrate may comprise a common electrode and a color filter layer. The upper substrate is assembled with the lower substrate to confine the LC layer and to form an LCD panel. The LCD displays images by applying electric field to the liquid crystal (LC) layer and by controlling light intensity transmitting through the device. The LCD also comprises a data driving circuit, a gate driving circuit, and a signal controlling circuit.

SUMMARY OF THE INVENTION

This invention provides a liquid crystal display (LCD) that has a short repaired path so that the repaired area does not degrade the quality of the LCD.

This invention also provides an operational amplifier to prevent quality degradation when the LCD is repaired.

Additional features of the invention will be set forth in the description which follows, and in part will be apparent from the description, or may be learned by practice of the invention.

The present invention discloses a thin film transistor substrate, comprising: a pixel comprising a thin film transistor; a gate line extending transversally and transmitting a gate signal; a data line extending longitudinally and transmitting a data signal; a first storage electrode line extending transversally; a second storage electrode line extending longitudinally; a third storage electrode line connecting two second storage electrode lines; and a repair assistant formed in the area that the third storage electrode line overlaps with the data line; wherein the data line is between the two second storage electrode lines.

The present invention also discloses a liquid crystal display, comprising: a display area comprising a pixel, a gate line, a data line, and a thin film transistor; a first storage electrode line extending transversally; a second storage electrode line extending longitudinally; a third storage electrode line connecting two second storage electrode lines; a repair assistant formed in the area that the data line overlaps with the third storage electrode line; and a repair line extending transversally and overlapping with the data line.

The present invention also discloses a method for manufacturing a liquid crystal display, comprising: forming a gate line extending transversally in a display area; forming a first storage electrode line extending transversally in the display area; forming a second storage electrode line extending longitudinally in the display area; forming a third storage electrode line coupling two second storage electrode lines in the display area; forming a data line extending longitudinally in the display area; forming a first repair assistant overlapping with the gate line in the display area: forming a repair line outside the display area; and forming a terminal line outside the display area.

The present invention also discloses a method for manufacturing a thin film transistor substrate, comprising: forming a gate line extending transversally; forming a first storage electrode line extending transversally; forming a second storage electrode line extending longitudinally; forming a third storage electrode line coupling two second storage electrode lines; forming a data line extending longitudinally; and forming a first repair assistant overlapping with the gate line.

It is to be understood that both the foregoing general description and the following detailed description are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

A thin film transistor substrate of one embodiment of the present invention comprises a pixel including a switching element like thin film transistor (TFT), a gate line extending transversally, a data line extending longitudinally, a first storage electrode line extending parallel to the gate line, a second storage electrode line extending parallel to the data line, a third storage electrode line connecting two of the second storage electrode lines, and a repairing pattern formed in the area intercrossing the data line and the third storage electrode line, wherein the data line is between two second storage electrode line. The repairing pattern may be coupled to the data line through a contact hole. The second storage electrode line may be coupled to the first storage electrode line.

An LCD of another embodiment of the present invention comprises the thin film transistor substrate described in the above embodiment, wherein the thin film transistor substrate may further comprise a repair line extending parallel to the gate line and intercrossing to the data line. The LCD may comprise a data driving integrated circuit (IC) applying data signals to the data line. The data driving IC may comprise a first operational amplifier and a second operational amplifier. The thin film transistor substrate may comprise a terminal line coupled to the input terminal or the output terminal of the first operational amplifier or the second operational amplifier. The terminal line may be formed in the same layer as the data line. The repair line may be formed in the same layer as the gate line.

The first storage electrode line may be coupled to the second storage electrode line through a bridge pattern crossing over the gate line.

Figure 1:
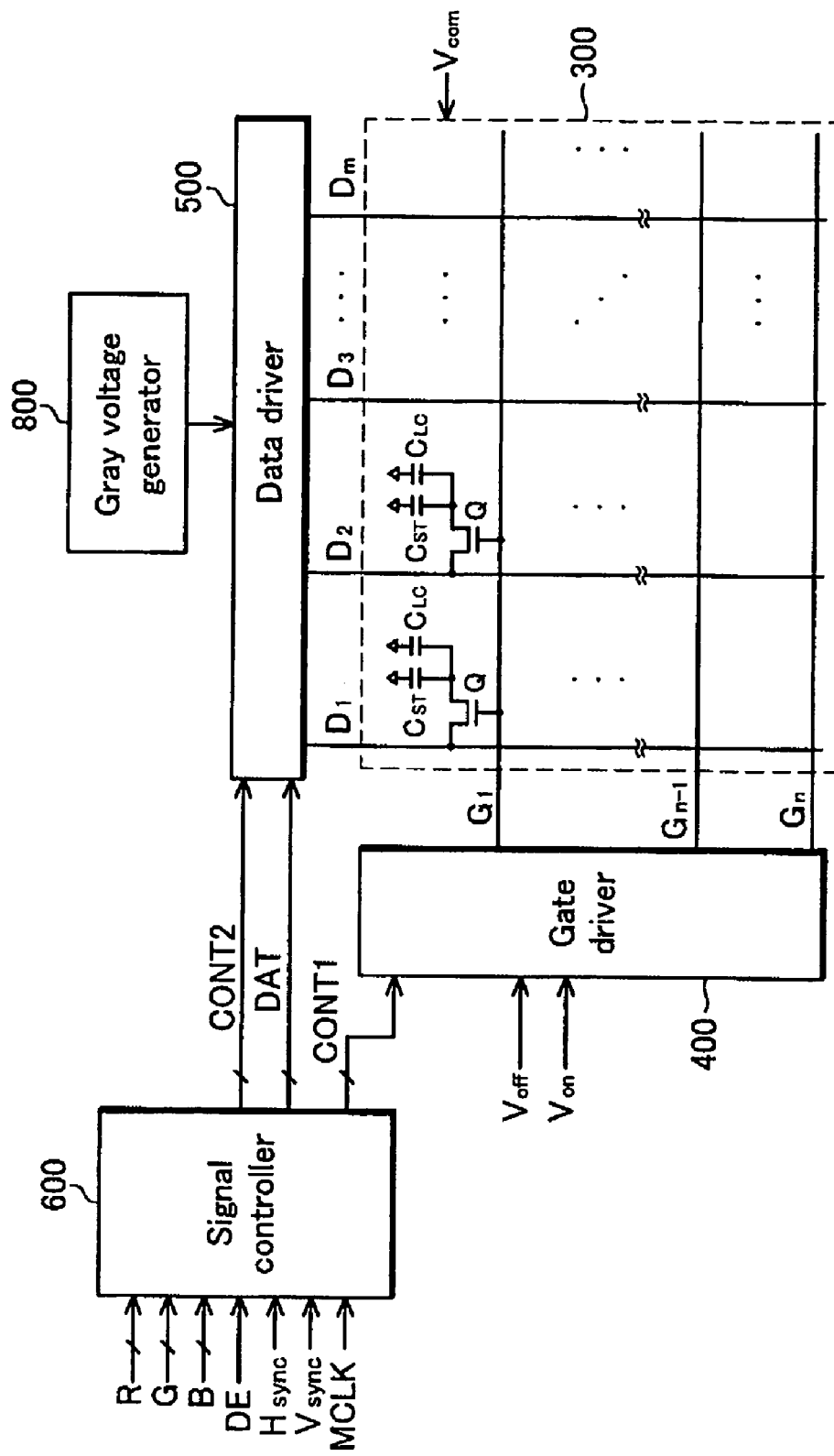
FIG. 1 shows a block diagram of an embodiment of the present invention.

As shown in FIG. 1, an LCD of an embodiment of the present invention comprises an LC panel assembly 300, a gate driver 400 coupled to the LC panel assembly 300, a data driver 500 coupled to the LC panel assembly 300, and a signal controller 600 controlling the signal of the gate driver 400 and the data driver 500.

Figure 2:
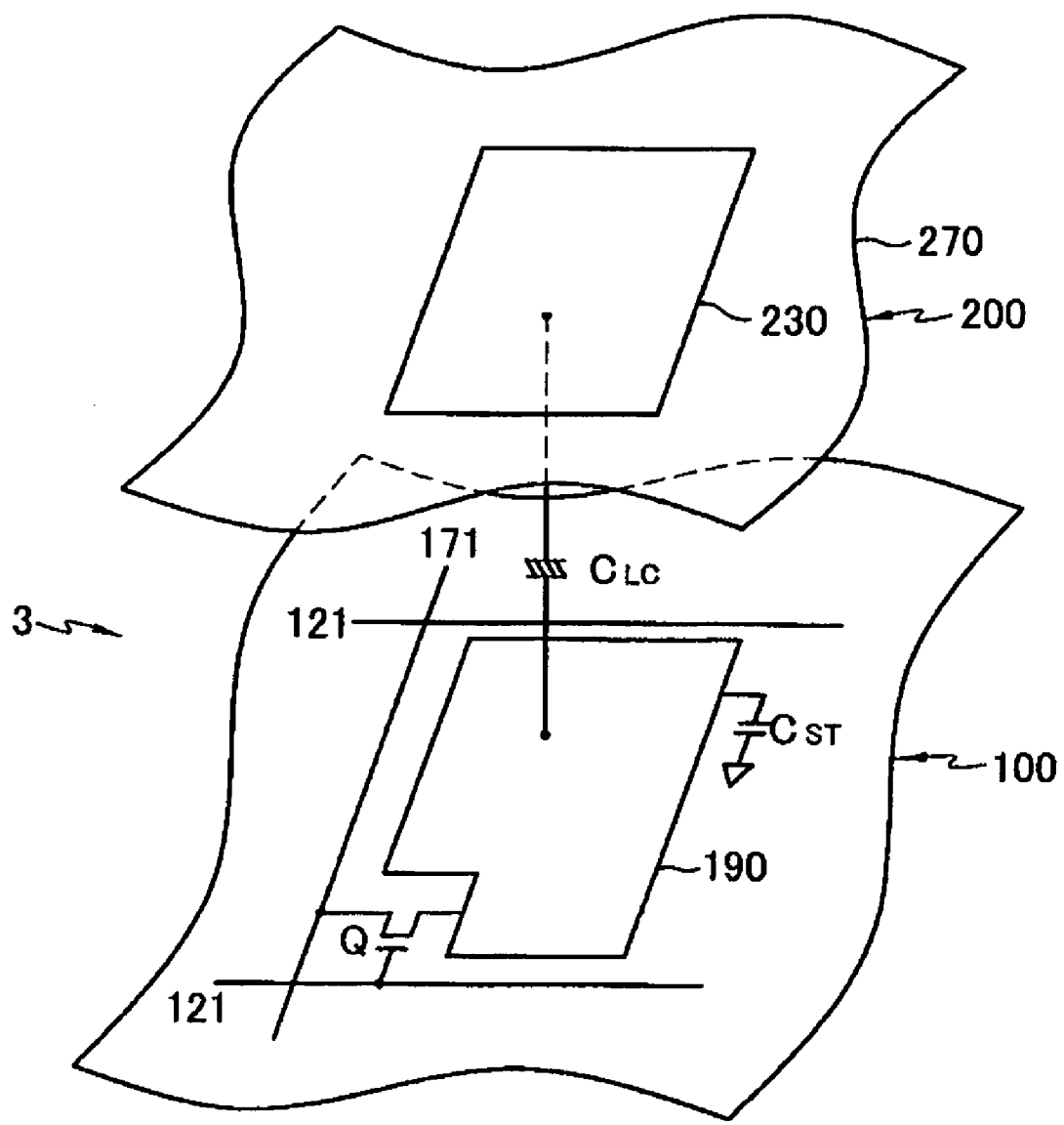
FIG. 2 shows an equivalent circuit of a pixel area of an embodiment of the present invention.
Figure 3:
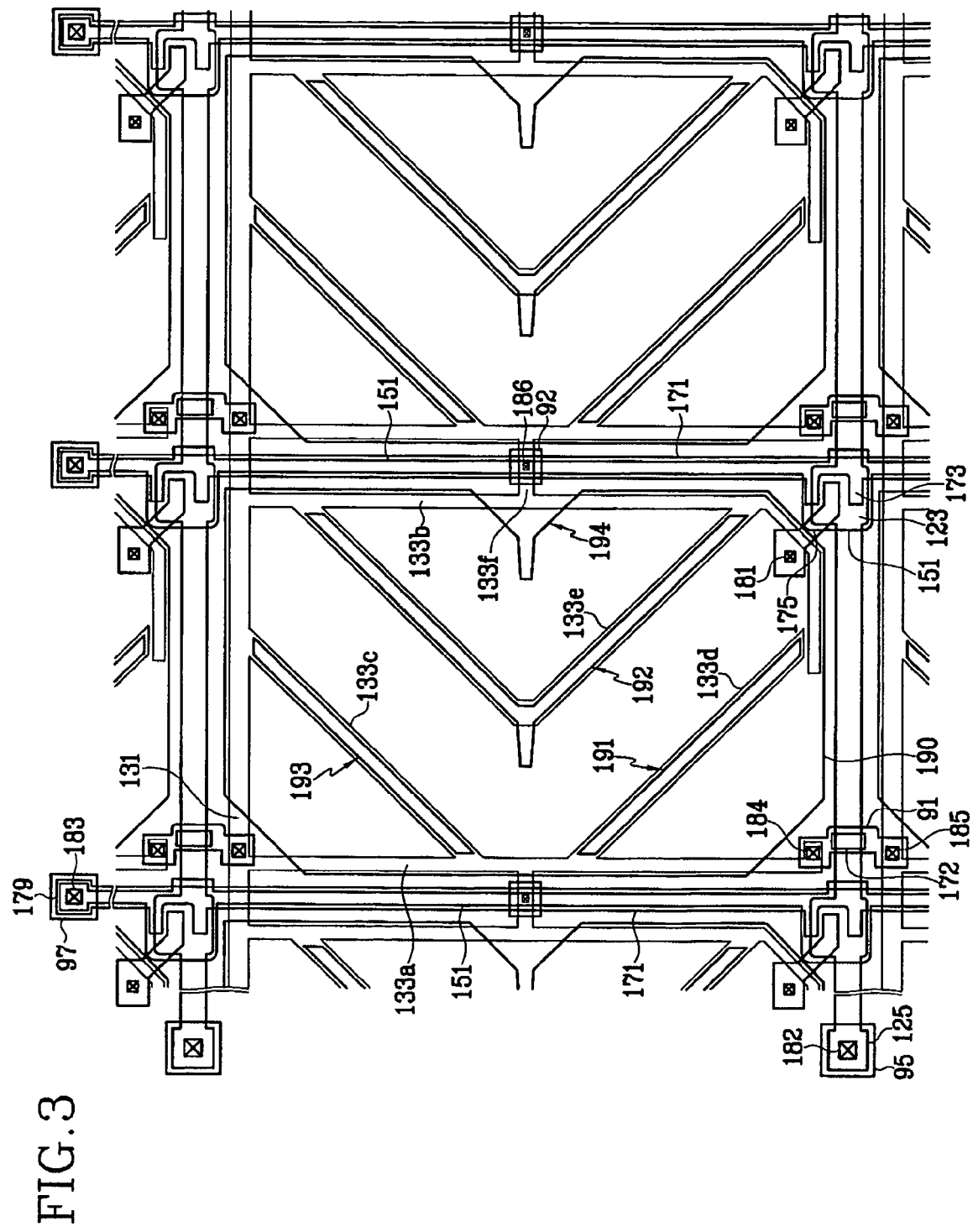
FIG. 3 shows a layout of a thin film transistor substrate of an embodiment of the present invention

As shown in FIG. 2, the LC panel assembly 300 comprises a gate line 121, a data line 171, and a pixel defined by the gate line 121 and the data line 171. The gate line 121 extends transversally. The data line 171 extends longitudinally.

Each pixel comprises a switching element Q like a thin film transistor (TFT), and an LC capacitor ($C_{LC}$) coupled to the switching element Q. The pixel may further comprise a storage capacitor ($C_{ST}$). The switching element Q is formed on the thin film transistor substrate 100. One terminal of the switching element Q is coupled to the gate line 121. Another terminal of the switching element Q is coupled to the data line 171. The other terminal of the switching element Q is coupled to the LC capacitor ($C_{LC}$) and to the storage capacitor ($C_{ST}$).

The LC capacitor ($C_{LC}$) comprises two terminals and a dielectric layer. The one terminal is a pixel electrode 190 on a lower substrate 100. The other terminal is a common electrode 270 on an upper substrate. The dielectric layer is an LC layer. The pixel electrode 190 is coupled to the switching element Q. The common electrode 270 is formed on most of the upper substrate 200. A common voltage ($V_{com}$) is applied to the common electrode 270. The common electrode 270 may be formed on the lower substrate 100. In this case one of the two electrodes 190 and 270 may be a line shape.

A storage capacitor ($C_{ST}$) that is a supplementary capacitor of the LC capacitor is formed on the lower substrate 100. The storage capacitor ($C_{ST}$) comprises two terminals and a dielectric layer. The one terminal is the pixel electrode 190. The other terminal is a storage electrode. A predetermined voltage is applied to the storage electrode. The predetermined voltage may be the common voltage ($V_{com}$). The storage electrode may be the gate electrode line that is next to the pixel.

A pixel may display red, green, or blue. A pixel may display red, green, and blue in turn. FIG. 2 shows a color filter 230 formed on the upper substrate and opposing to the pixel electrode 190. The color filter 230 may be formed on the lower substrate 100.

A polarizer is placed on a side of the LC panel assembly 300. A gray voltage generator 800 makes two sets of gray signals. One set of the gray signals is higher than the common voltage and the other set is lower than the common voltage. A gate driver 400 is coupled to the gate lines of the LC panel assembly. The gate driver 400 applies gate signals to the gate lines. The gate driver 400 comprises a plurality of integrated circuits (ICs). A data driver 500 is coupled to the data lines. The data driver 500 selects proper signals from the gray voltage generator 800 and applies the proper signals to the data lines. The data driver 500 comprises a plurality of ICs.

A gate driving IC mounted on a tape carrier package (TCP) may be attached on the LC panel assembly 300. A gate driving IC may be mounted on the lower substrate directly. A gate driver 400 may be formed on the lower substrate directly.

A signal controller 600 controls the gate driver 400 and the data driver 500. The signal controller 600 receives input image signals and input control signals from a graphic controller. The input control signals comprise vertical synchronize signals ($V_{sync}$), horizontal synchronize signals ($H_{sync}$), main clock signals, and data enable signals (DE). The signal controller 600 processes the image signals and the control signals, and generates gate control signals and data control signals. The gate control signals are sent to the gate driver 400. The data control signals and the processed image signals are sent to the data driver 500.

The gate control signals comprise a vertical synchronizing signal, a gate clock signal and an output enable signal (OE). The vertical synchronizing signal indicates the starting time of gate voltages (Von). The gate clock signal controls the output time of the gate voltages. The output enable signal (OE) defines the lasting time of the gate voltages.

The data control signals comprise horizontal synchronizing signals, load signals, reverse signals, and data clock signals. The horizontal synchronizing signals indicate the starting time of the video signals. The load signals indicate the time to send video signals to each data line. The reverse signals indicate the time to switch polarity of the video signals with respect to the common voltage. The data clock signals control the output times of the data signals.

The data driver 500 receives video data from the signal controller 600. The data driver 500 selects proper gray voltages from the gray voltage generator 800 to correspond with the video data received from the signal controller 600. The data driver 500 sends the gray voltages to proper data lines.

The gate driver 400 receives gate controlling signals from the signal controller 600. The gate driver 400 applies gate signals to the gate lines. The gate signals turn on TFTs formed in each pixel area. The data signals are applied to each pixel when the TFTs are turned on.

The data voltages applied to each pixel electrode make pixel voltages with respect to the common voltage. The LC molecules align according to the pixel voltages. Polarization of the light going through the LC layer depends on the alignment of the LC molecules. Polarizers placed on the surfaces of the substrates 100 and 200 change transmittance of the light going through the LC panel assembly according to the polarization of the light.

After one row is done, the data driver 500 and the gate driver 400 repeat similar works to the next row of the pixels. After all of the video signals are applied to the whole frame, new video signals are applied to the frame. The polarity of the video signals applied to each pixel during the frame time is switched from the polarity of the former frame time. A dot inversion, a row inversion, a column inversion, a frame inversion, or a two dot inversion may be used in order to prevent display quality degradation.

An embodiment of the present invention is described hereinafter in connection with FIGS. 3, 4, 5, 6, and 7.

An LCD comprises a TFT substrate 100, an upper substrate 200 opposing to the TFT substrate 100, and an LC layer 3 confined between the TFT substrate 100 and the upper substrate 200. The LC layer 3 comprises LC molecules 310 aligned vertically to the surface of the substrates 100 and 200.

The TFT substrate 100 comprises an insulation plate 110. A plurality of gate lines 121 are formed on the insulation plate 110. The gate lines 121 extend transversally. A portion of each gate line forms a gate electrode 123. The gate electrodes 123 may protrude from the gate lines 121. A gate line 121 may have a contact area that is wider than the other portion and may contact to an outer circuit. A gate line 121 may be coupled to a gate driving circuit that is formed on the thin film transistor substrate 100.

A storage electrode line 131 may be formed on the same layer as the gate line 121. The storage electrode line has storage electrode branches 133a, 133b, 133c, 133d, 133e, and 133f. The first storage electrode 133a and the second storage electrode 133b extend longitudinally. The third storage electrode 133c extends 45 degree from a horizontal line. The forth storage electrode 133d extends −45 degree from the horizontal line. The fifth storage electrode 133e is a combined shape of 133c and 133d. The sixth storage electrode 133f extends transversally and couples the second storage electrode 133b to the first storage electrode 133a of the next pixel. An end of the first storage electrode 133a is coupled to the storage electrode line 131. The other end of the first storage electrode line 133a is open and has a protrusion.

The gate line 121 and the storage electrode line 131 are made of metal like aluminum (Al), aluminum alloy (Al alloy), silver (Ag), silver alloy (Ag alloy), chromium (Cr), titanium (Ti), tantalum (Ta), molybdenum (Mo) etc. The gate line 121 and the storage electrode line 131 may be formed with single layer or double layer. One layer of the double layer may be made of a material that has a good mechanical endurance and chemical resistance like Cr, Mo, Ti, Ta, etc. The other layer of the double layer may be made of a good conductive material like Al, Al alloy, etc. The sides of the gate line 121 and the storage electrode line 131 taper with an angle ranging between 30° and 80° with respect to the surface of the insulation plate 110, which makes easier for upper layers to run over.

A gate insulation layer 140 is formed on the gate line 121 and the storage electrode line 131. The gate insulation layer 140 is made of silicon nitride ($SiN_x$) or silicon oxide ($SiO_x$). A plurality of data line 171 and a plurality of drain electrode 175 are formed on the gate insulation layer 140. The data lines 171 extend longitudinally. Each data line 171 has a plurality of source electrode 173 extending from the data line 171 and having a basin toward the drain electrode 175. One end of the data line 171 has a contact area 179 that is wider than the other portion and contacts with outer circuit.

The data line 171 and the drain electrode 175 may be made of a metal like aluminum (Al), aluminum alloy (Al alloy), silver (Ag), silver alloy (Ag alloy), chromium (Cr), titanium (Ti), tantalum (Ta), molybdenum (Mo), molybdenum alloy (Mo alloy) etc. The data line 171 and the drain electrode 175 may be formed with multi layers of the above metals, for example, three layers of Mo/Al alloy/Mo or two layers of Cr/Al.

A semiconductor layer 151 is formed under the data line 171 and the drain electrode 175. The semiconductor layer extends toward the gate electrode and forms a channel area of a TFT. The semiconductor layer may be made of amorphous silicon. An ohmic contact layer 161 is formed between the data line 171 and the semiconductor layer 151. An ohmic contact layer may reduce contact resistance between a metal layer and a semiconductor layer. The ohmic contact layers 161 may be made of a silicide or an n-type extrinsic amorphous silicon.

A data line 171, a drain electrode 175, and a metal piece 172 are formed on the ohmic contact layer 161. The data line 171 extends longitudinally. The data line 171 is formed between the first storage electrode 133a and the second storage electrode 133b in a plan view. An end of the data line 171 is wider than the other portion to contact an outer circuit. A protrusion comes out from the data line 171 and form a source electrode 173. An end of the drain electrode 175 is wider than the other end to couple to another layer. The source electrode 173 is curved around an end of the drain electrode 175. The gate electrode 123, the source electrode 173, the drain electrode 175, and the semiconductor layer 151 form a thin film transistor. The metal piece 172 overlaps with the gate line 121. The metal piece 172 is formed with the same metal as the data line 171.

A passivation layer 180 is formed on the drain electrode 175 and the data line 171. The passivation layer 180 may be made of an organic photo resist, a low dielectric material, or silicon nitride ($SiN_x$). The low dielectric material may be formed by plasma enhanced chemical vapor deposition (PECVD). The low dielectric material may be a-Si:C:O or a-Si:O:F.

Contact holes 181 and 183 are formed in the passivation layer 180 to expose an end of the drain electrode 175 and an end of the data line 171. A contact hole 182 is formed through the passivation layer 180 and the gate insulation layer 140 to expose the end portion 125 of the gate line 121. A contact hole 184 is formed through the passivation layer 180 and the gate insulation layer 140 to expose the protrusion area of the first storage electrode 133a. A contact hole 185 is formed through the passivation layer 180 and the gate insulation layer 140 to expose a portion of the storage electrode line 131. A contact hole 186 is formed in the passivation layer 180 to expose a portion of the data line 171 that overlaps with the sixth storage electrode 133f. The shape of the contact holes 181, 182, 183, 184, 185, and 186 may be polygonal or circular. The walls of the contact holes are inclined A pixel electrode 190, contact assistant 95 and 97, a bridge 91 connecting storage electrode line 131 and the first storage electrode 133a, and a connection assistant 92 are formed on the passivation layer 180. The pixel electrode 190 is made of ITO or IZO.

The pixel electrode 190 and the common electrode 270 form an LC capacitor along with the LC layer. The LC capacitor retains the voltage between the pixel electrode and the common electrode after turning off the TFT. A storage capacitor is formed to support retaining the voltage. The storage capacitor is formed by overlapping the pixel electrode with the storage electrode line and the storage electrodes.

The pixel electrode 190 is chamfered at its three corners. The chamfered oblique sides form an angle of about 45 degree with the gate line 121. Opening windows 191, 192, 193, and 194 are formed in the pixel electrode 190. The opening windows divide the pixel electrode into plural domains. The opening pattern is substantially symmetrical with respect to an imaginary horizontal line dividing the pixel area into two equal parts.

The lower opening pattern 191 extends from the lower side of the pixel electrode to upper left direction. The upper opening pattern 193 extends from the upper side of the pixel electrode to lower left direction. The V-shape opening pattern 192 extends from center of the pixel to upper right direction and to lower right direction. The upper opening pattern 193 forms a right angle with the lower opening pattern 191. The V-shape opening pattern 192 has a portion parallel to the upper opening pattern 193 and a portion parallel to the lower opening pattern.

The center opening pattern 194 extends from the right side of the pixel electrode to left direction. The end portion of the center opening pattern 194 is chamfered. The chamfered side of the center opening pattern 194 forms an angle of 45 degree with the gate line 121.

The connection bridge 91 crosses over the gate line 121. The connection bridge is coupled to the first storage electrode 133a and the storage electrode line 131 through the contact holes 184 and 185. The connection bridge 91 overlaps with the metal piece 172. The connection bridge 91 may be electrically coupled to the metal piece 172. The storage electrode line 131, the storage electrodes 133a, 133b, 133c, 133d, 133e, and 133f, the connection bridge 91, and the metal piece 172 may be used to repair the data line 171, or the gate line 121. The connection bridge may be electrically connected to the gate line to repair the gate line by applying laser beam or other similar one. The metal piece 172 may assist the connection between the bridge 91 and the gate line 121.

Figure 7:
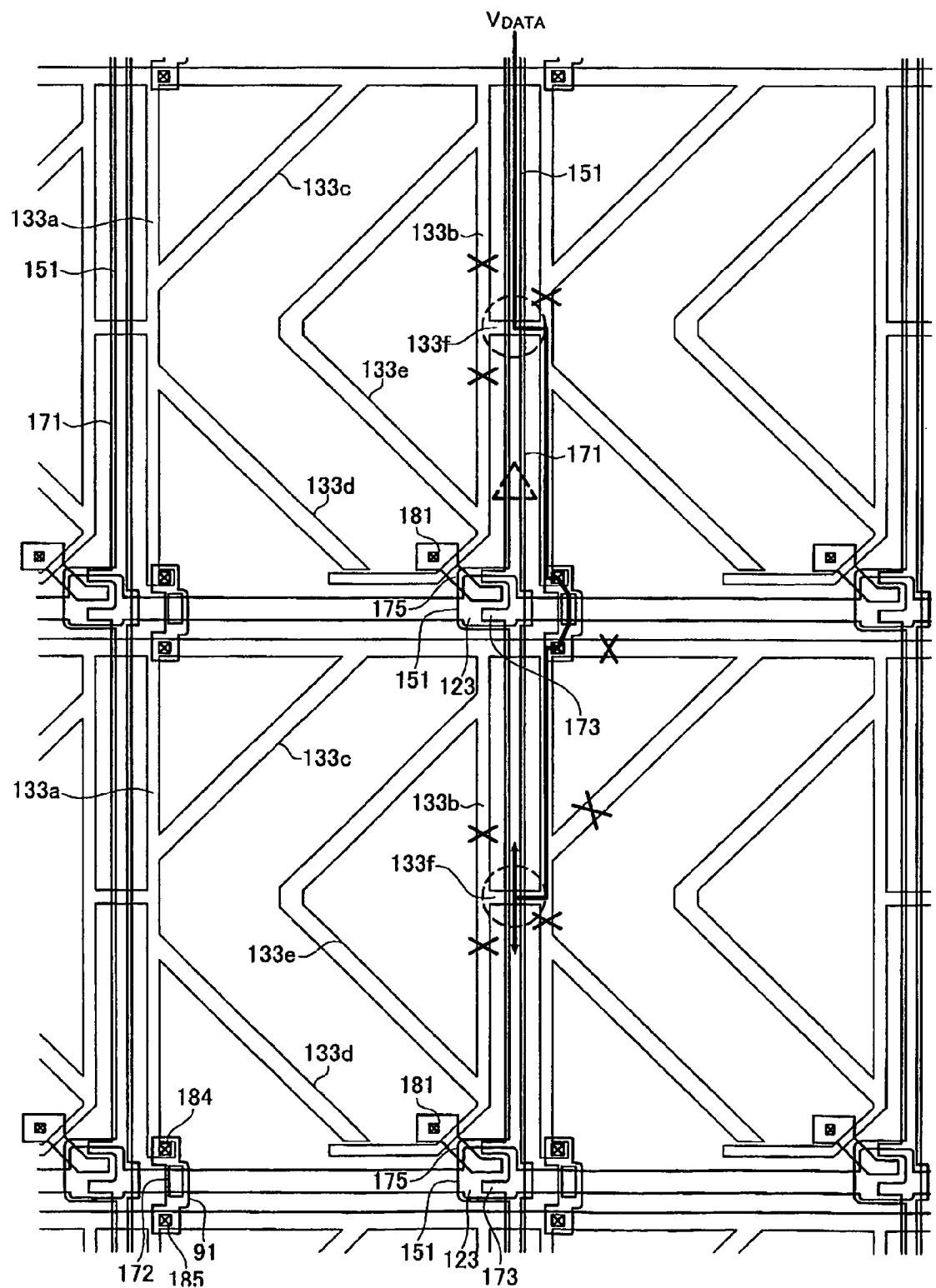
FIG. 7 shows a plan view of an example of repair of an embodiment of the present invention.

The repair assistant 92 overlaps a portion of the data line 171 and the sixth storage electrode 133f, that may be used to repair data line 171. As shown in FIG. 7, the sixth storage electrode is coupled to the data line 171 and the points marked with X are disconnected to repair the open data line 171. The triangle shows an open area. The data signal may be transferred through the bold line path. The repair assistant helps the connection between the data line 171 and the sixth storage electrode 133f.

Figure 4:
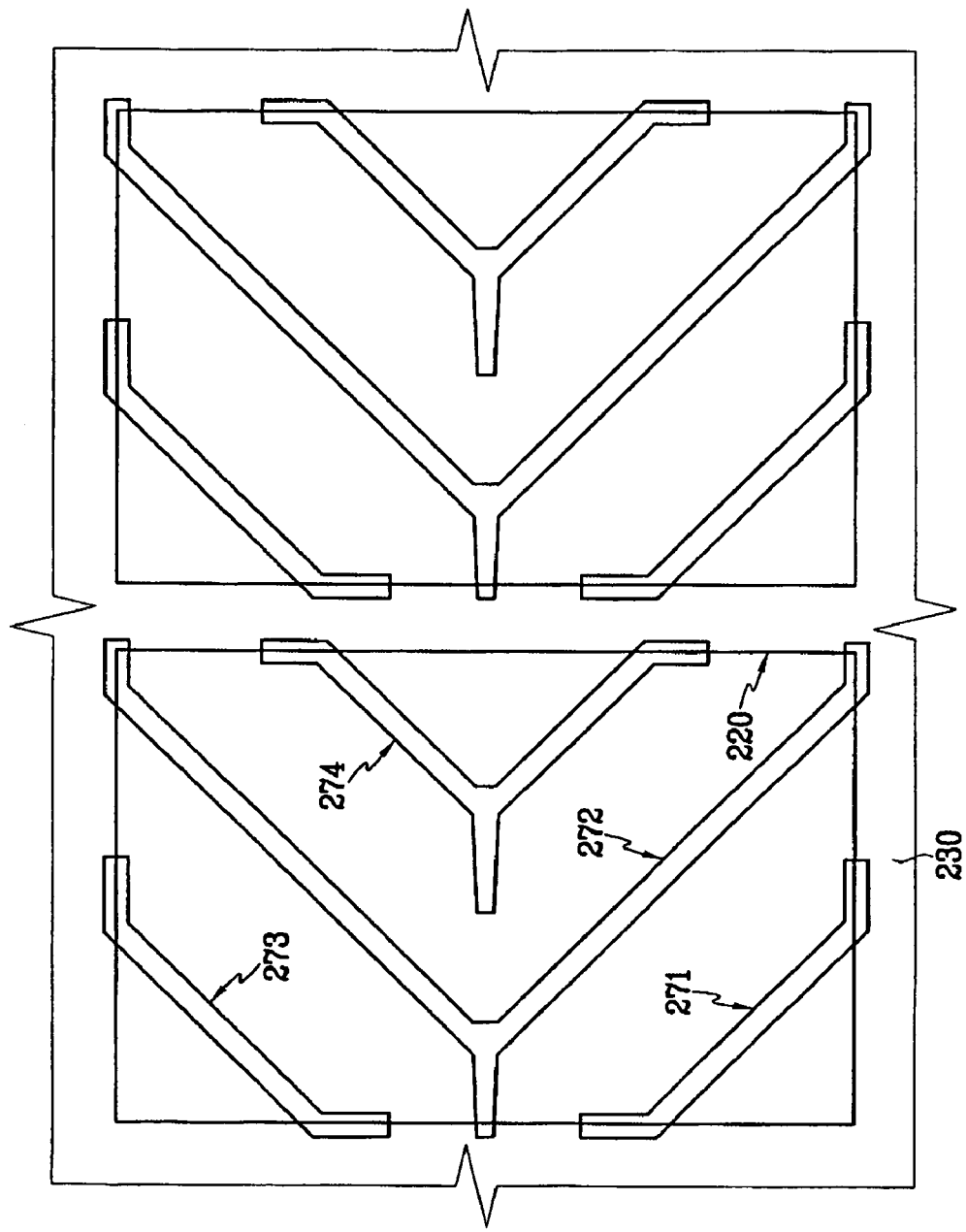
FIG. 4 shows a layout of a common electrode substrate of an embodiment of the present invention.
Figure 5:
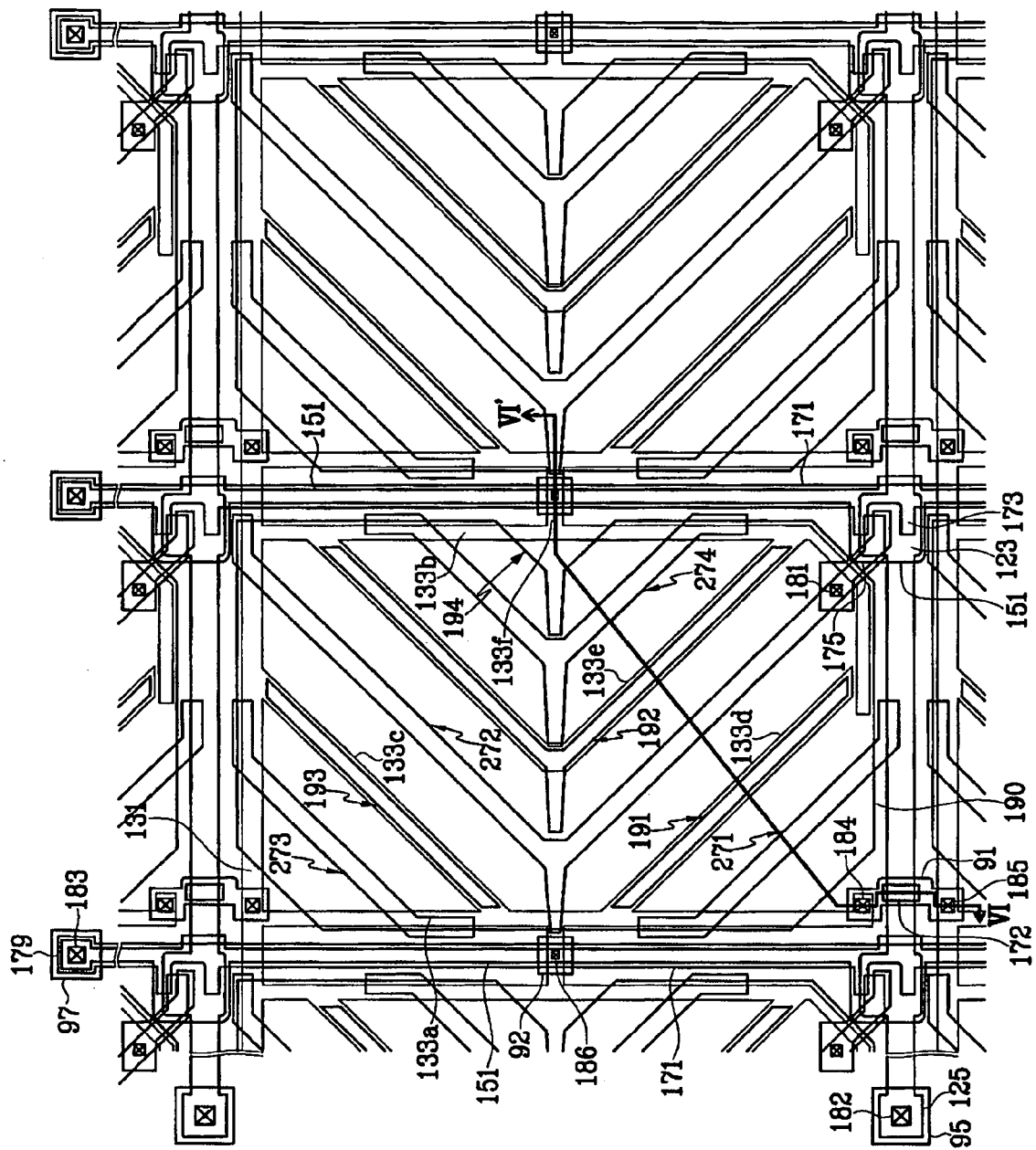
FIG. 5 shows a layout of an assembly of the thin film transistor substrate of FIG. 3 and the common electrode substrate of FIG. 4.
Figure 6:
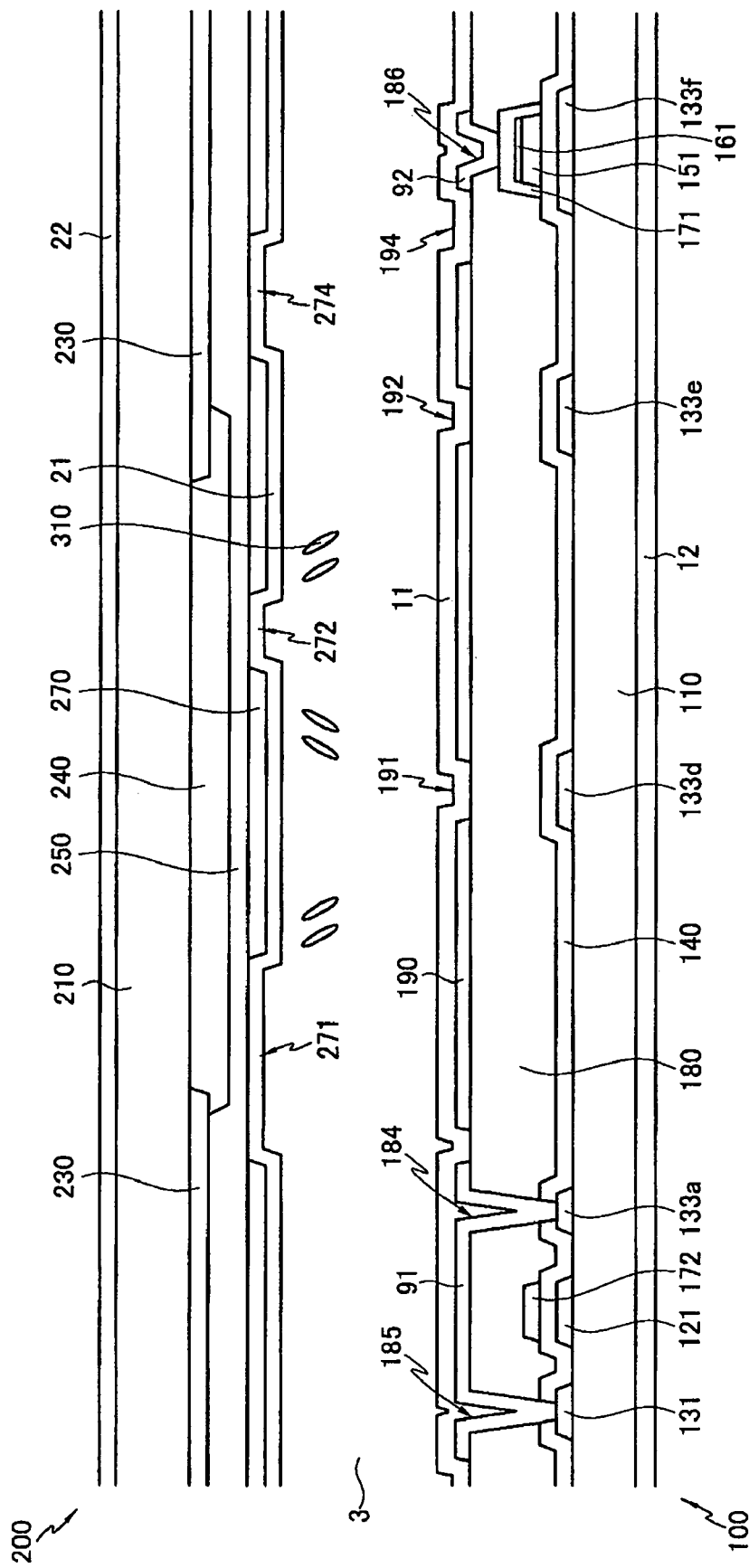
FIG. 6 shows a cross sectional view of IV-IV' of FIG. 5.

The common electrode substrate is described hereinafter with reference to FIGS. 4, 5, and 6.

A black matrix 220 is formed on an insulation plate 210. A color filter layer 230 is formed on the black matrix 220. The color filter 230 may be red, green, or blue. An overcoat layer 250 may be formed on the color filter layer 230. A common electrode 270 is formed on the common electrode substrate. The common electrode 270 is made of a transparent conductor like ITO, IZO, or another similar material. The common electrode has a set of opening patterns. The set of the opening patterns comprise a lower opening pattern 271, an upper opening pattern 273, a first V-shape opening pattern 272, and a second V-shape opening pattern 274. One set of the opening patterns oppose a pixel electrode 190. Each opening pattern 271, 272, 273, and 274 places between the opening patterns in the pixel electrode, or between an opening pattern and an oblique side of the pixel electrode in a plan view. At least a portion of each opening pattern 271, 272, 273, and 274 extends parallel to at least one of the upper opening pattern 193 and the lower opening pattern 191 of the pixel electrode. The distances between two adjacent parallel opening patterns may be the same in a plan view.

The lower opening pattern 271 extends obliquely from the left side of the pixel electrode to lower side of the pixel electrode that make an obtuse angle with the oblique portion. The lower opening pattern also comprises a parallel portion to the left side of the pixel electrode. The lower opening pattern also comprises a parallel portion to the lower side of the pixel electrode. The upper opening pattern 273 extends obliquely from the left side of the pixel electrode to the upper side of the pixel electrode. The upper opening pattern also comprises a parallel portion to the left side of the pixel electrode that makes an obtuse angle with the oblique portion. The lower opening pattern also comprises a parallel portion to the upper side of the pixel electrode that makes an obtuse angle with the oblique portion.

Each of the first V-shape opening pattern 272 and the second V-shape opening patterns 274 may comprise a portion extending transversally, a portion extending upper right direction from an end of the transversal portion, and a portion extending lower right direction. The first V-shape opening pattern 272 may comprise a portion overlapping with the upper side or the lower side of the pixel electrode. The second V-shape opening pattern 274 may comprise a portion overlapping with the right side of the pixel electrode.

The number of the opening pattern may depend on the pixel size or other design factors. The black matrix 220 may overlap the opening patterns to block light leakage. Vertical alignment layers 11 and 21 may be coated on the inner surface of the substrate 100 and 200 respectively. Polarizers 12 and 22 may be attached on the outer surface of the substrate 100 and 200 respectively. The transmit axes of the two polarizers 12 and 22 cross and make a right angle with each other. One of the transmit axes of the two polarizers 12 and 22 may be parallel to the gate line. One of the two polarizers 12 and 22 may be omitted in a reflective LCD.

At least one compensation film may be included in the LCD of the present invention. The compensation film may compensate the retardation of light coming through the LC layer 3. The longer axis of the LC molecules may be vertically aligned to the surface of the substrates 100 and 200. The LC layer 3 may have a negative dielectric anisotropy.

The opening patterns 191, 192, 193, 194, 271, 272, 273, and 274 may define the inclining direction of the LC molecules. One or more of the opening patterns 191, 192, 193, 194, 271, 272, 273, and 274 may be substituted by a protrusion.

A method for manufacturing the present embodiment is described hereinafter.

Aluminum (Al), aluminum alloy (Al alloy), silver (Ag), silver alloy (Ag alloy), chromium (Cr), titanium (Ti), tantalum (Ta), molybdenum (Mo), molybdenum alloy, or a similar metal is deposited on a dielectric plate 110. A gate line 121 including a gate electrode 123 and an end portion 125, and a storage electrode line 131 including storage electrodes 133a, 133b, 133c, 133d, 133e, and 133f are formed with the metal layer by photolithography.

A gate insulation layer 140, an intrinsic amorphous silicon layer, and an extrinsic amorphous silicon layer are deposited successively. An intrinsic amorphous silicon pattern and an extrinsic amorphous silicon pattern are formed on the gate insulation layer 140 by a photolithography.

Aluminum (Al), aluminum alloy (Al alloy), silver (Ag), silver alloy (Ag alloy), chromium (Cr), titanium (Ti), tantalum (Ta), molybdenum (Mo), molybdenum alloy, or a similar metal is deposited on the gate insulation layer and the extrinsic amorphous silicon pattern. A data line 171, an end portion 179 of the data line, a drain electrode 175, a source electrode 173, and a metal piece 172 are formed with the metal layer by photolithography. The exposed portion of the extrinsic amorphous silicon pattern is removed so that the intrinsic amorphous silicon pattern 151 is exposed. The exposed intrinsic amorphous silicon pattern may be plasma oxidized to stabilize the surface of the intrinsic amorphous silicon pattern 151.

A passivation layer 180 is formed on the exposed intrinsic amorphous silicon pattern 151, on the data line 171, on the gate insulation layer 140 and on the other area. The passivation layer 180 may be made of a-Si:C:O, a-Si:O:F, $SiN_x$, or an organic material. a-Si:C:O may be formed by chemical vapor deposition with $SiH(CH_3)_3$, $SiO_2(CH_3)_4$, $(SiH)_4O_4(CH_3)_4$, or $Si(C_2H_5O)_4$ as a source. At least one of $N_2O$, $O_2$, Ar, and He may be an additive to the source. a-Si:O:F may be formed by chemical vapor deposition with $SiH_4$ or $SiF_4$ as a source. At least one of $O_2$ and $CF_4$ may be an additive to the source.

A portion of the passivation layer 180 and a portion of the gate insulation layer 140 is removed by photolithography to expose the end portion 125 of the gate line 121, the end portion 179 of the data line 171, a portion of the storage electrode 133a, a portion of storage electrode line 131, and the other contact holes 181, 182, 183, 184, 185, and 186.

A transparent conductor layer like IZO, ITO, or other similar material is deposited and patterned by photolithography to form a pixel electrode 190, contact assistants 95 and 97, the storage electrode connecting bridge 91, and the repair assistant 92. The TFT substrate may be preheated with nitrogen gas or other similar gas to prevent the metal layer being oxidized before ITO or IZO is deposited.

Figure 8:
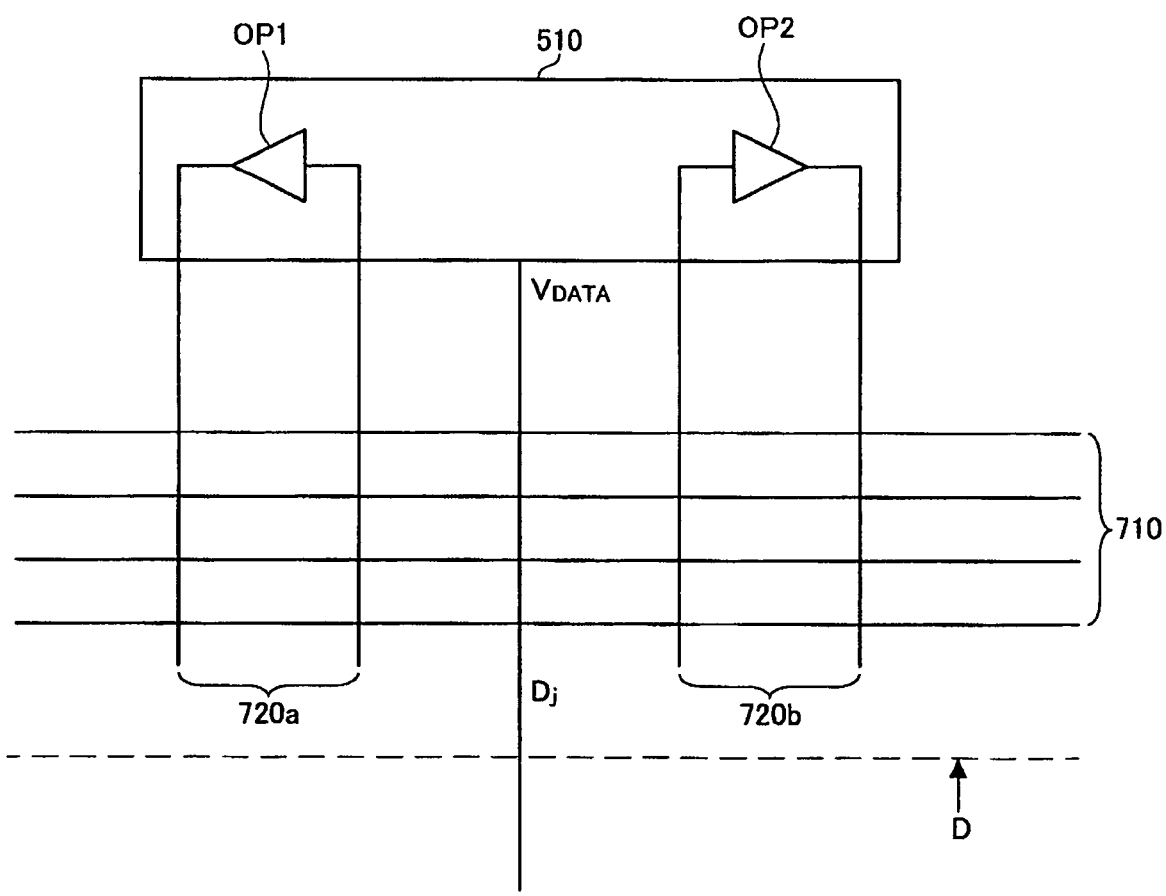
FIG. 8 shows a repair line structure of an embodiment of the present invention.
Figure 9:
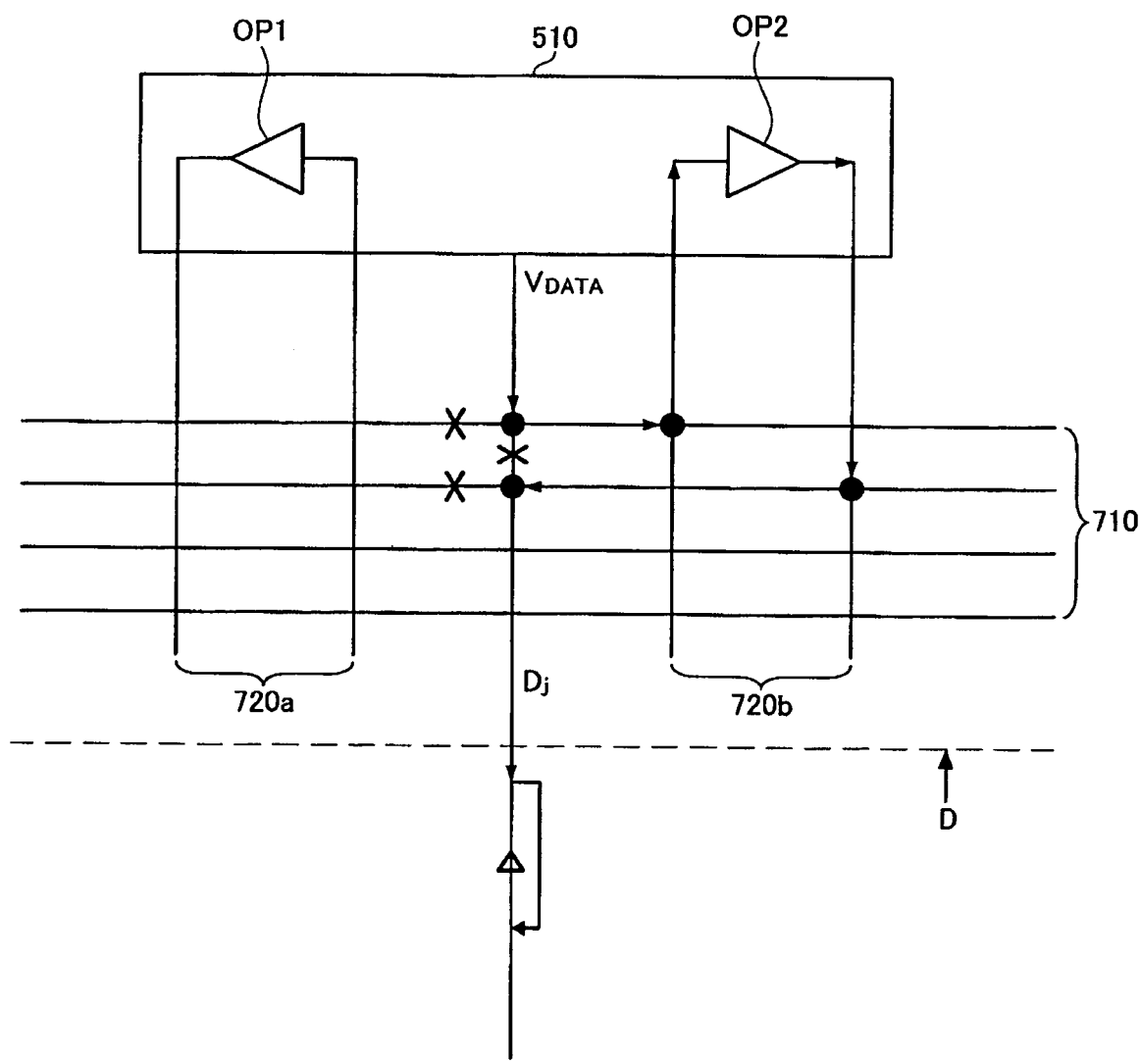
FIG. 9 shows an example of repair of an embodiment of the present invention.

Another embodiment of the present invention is shown in FIGS. 8 and 9. A data driving IC 510 has operational amplifiers OP1 and OP2. Terminal lines 720a and 720b are connected to the input ends and the output ends of the operational amplifier OP1 and OP2. The terminal lines 720a and 720b cross over a repair line 710. The repair line 710 may be formed with the gate line metal layer. The terminal lines 720a and 720b may be formed with the data line metal layer. The repair line 720 and the terminal lines 720a and 720b are formed at the outer area of the pixel area. As shown in FIG. 9, if a data line $D_j$ is open, the data line may be coupled to the repair line 710 at two positions. The data line is disconnected between the two positions. The terminal line 720b and the repair line 710 are also shortened as marked with black dots. If a data line is disconnected and repaired, the path transferring data signals becomes longer than the other data lines, and the electric contact resistance of the repaired points may be too big to display a proper image. In this case, the operational amplifier may compensate signal delays and may display a good quality image. The other side and the remainder of the repair line 710 may be open to reduce load of the repaired data line.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A thin film transistor substrate, comprising:
a thin film transistor;
a gate line extending in a first direction and which transmits a gate signal to the thin film transistor;
a data line extending in a second direction and which transmits a data signal to the thin film transistor;
a plurality of first storage electrode lines extending in the first direction;
a plurality of second storage electrode lines extending in the second direction;
a plurality of third storage electrode lines connecting adjacent second storage electrode lines; and
a repair assistant formed where a third storage electrode line of the plurality of the third storage electrode lines overlaps the data line, the repair assistant overlapping the third storage electrode line;
wherein the data line is located between adjacent second storage electrode lines and disposed between the third storage electrode line and the repair assistant, and
wherein the third storage electrode line is formed on a different layer from the repair assistant.

2. The thin film transistor substrate of claim 1,
wherein the repair assistant is coupled to the data line through a contact hole.

3. The thin film transistor substrate of claim 2, further comprising:
a bridge crossing over the gate line;
wherein the bridge couples the first storage electrode line to the second storage electrode line.

4. A liquid crystal display, comprising:
a display area comprising a gate line, a data line, and a thin film transistor;
a first storage electrode line extending in a first direction substantially parallel to the gate line;
a second storage electrode line extending in a second direction substantially perpendicular to the gate line;
a third storage electrode line connecting the second storage electrode line in adjacent pixels;
a repair assistant formed where the data line overlaps the third storage electrode line, the repair assistant overlapping the data line; and
a repair line extending in the first direction and overlapping with the data line,
wherein the data line is disposed between the third storage electrode line and the repair assistant, and
wherein the third storage electrode line is formed on a different layer from the repair assistant.

5. The liquid crystal display of claim 4, further comprising:
a data driving integrated circuit.

6. The liquid crystal display of claim 5,
wherein the data driving integrated circuit comprises an operational amplifier having an output end and an input end.

7. The liquid crystal display of claim 6, further comprising:
a first terminal line coupled to the output end of the operational amplifier; and
a second terminal line coupled to the input end of the operational amplifier.

8. The liquid crystal display of claim 7,
wherein the first terminal line and the second terminal line are formed on the same layer as the data line.

9. The liquid crystal display of claim 8,
wherein the repair line is formed on the same layer as the gate line.

10. The liquid crystal display of claim 9,
wherein the repair assistant is coupled to the data line through a contact hole.

11. The liquid crystal display of claim 10, further comprising:
a bridge crossing over the gate line;
wherein the bridge couples the first storage electrode line to the second storage electrode line.

12. The liquid crystal display of claim 11,
wherein the third storage electrode line is electrically coupled to the data line, and at least one position of the first storage electrode line and the second storage electrode line is disconnected in the adjacent pixel.

13. The liquid crystal display of claim 12,
wherein at least two places of the terminal lines are coupled to the repair lines, and at least one position of the data line is coupled to the repair line.

14. A method for manufacturing a thin film transistor substrate, comprising:
forming a gate line extending in a first direction on a substrate;
forming a first storage electrode line extending in the first direction on the substrate;
forming a second storage electrode line extending in a second direction on the substrate;
forming a third storage electrode line coupling the second storage electrode line adjacent thereto;
forming a data line extending in the second direction on the substrate; and forming a first repair assistant overlapping the data line and the third storage electrode line, wherein the data line is disposed between the third storage electrode line and the repair assistant, and wherein the third storage electrode line is formed on a different layer from the repair assistant.

15. The method of claim 14, further comprising:

forming a pixel electrode on a passivation layer on the substrate; and forming a second repair assistant overlapping with the gate line.

16. The method of claim 15, further comprising:

forming a bridge crossing over the gate line, wherein the first repair assistant, the second repair assistant and the bridge are formed on a same layer as the pixel electrode.

17. A thin film transistor substrate, comprising:

a thin film transistor;

a gate line extending in a first direction and which transmits a gate signal to the thin film transistor;

a data line extending in a second direction and which transmits a data signal to the thin film transistor;

a first storage electrode line extending in the first direction;

a second storage electrode line extending from the first storage electrode line in the second direction;

a third storage electrode line extending from the first storage electrode line in the second direction, substantially parallel to the second storage electrode line;

a fourth storage electrode line extending obliquely from the first storage electrode line to the second storage electrode line; and a fifth storage electrode line extending from the second storage electrode line in a direction substantially perpendicular to the fourth storage electrode line.

18. The thin film transistor substrate of claim 17, further comprising:

a sixth storage electrode line extending from the third storage electrode line in a direction substantially parallel to the fourth storage electrode line; and a seventh storage electrode line extending from the third storage electrode line in a direction substantially parallel to the fifth storage electrode line, wherein the sixth and seventh storage electrode lines a connected at their distal ends.

19. The thin film transistor substrate of claim 17, further comprising:

an eighth storage electrode line extending from the third storage electrode line of a first pixel to the second storage electrode line of a second pixel adjacent to the first pixel.

* * * * *